(12) United States Patent
Freimann et al.

(10) Patent No.: US 9,568,394 B2
(45) Date of Patent: Feb. 14, 2017

(54) OPTICAL DEVICE

(71) Applicant: CARL ZEISS SMT GmbH, Oberkochen (DE)

(72) Inventors: Rolf Freimann, Aalen (DE); Heiko Feldmann, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 270 days.

(21) Appl. No.: 14/034,009

(22) Filed: Sep. 23, 2013

(65) Prior Publication Data

US 2014/0023835 A1 Jan. 23, 2014

Related U.S. Application Data

(63) Continuation of application No. PCT/EP2012/054813, filed on Mar. 19, 2012.

(Continued)

(30) Foreign Application Priority Data

Mar. 21, 2011 (DE) .................. 10 2011 005 826

(51) Int. Cl.
*G03B 27/54* (2006.01)
*G01M 11/00* (2006.01)
(Continued)

(52) U.S. Cl.
CPC ............. *G01M 11/00* (2013.01); *G01M 11/02* (2013.01); *G03F 7/70358* (2013.01); *G03F 7/70591* (2013.01); *Y10T 428/24802* (2015.01)

(58) Field of Classification Search
CPC ........ G01M 11/00; G01M 11/02; G03F 7/706; G03F 7/70358; G03F 7/70591
(Continued)

(56) References Cited

U.S. PATENT DOCUMENTS 5,153,916 A * 10/1992 Inagaki ............... G03F 7/70591
382/151
5,524,131 A * 6/1996 Uzawa ............... G03F 7/70008
378/160

(Continued)

FOREIGN PATENT DOCUMENTS

DE 101 09 929 A1 11/2001
DE 102 53 874 A1 5/2004
(Continued)

OTHER PUBLICATIONS

International Search Report of PCT/EP2012/054813 dated Sep. 3, 2012.
(Continued)

*Primary Examiner* — Peter B Kim
(74) *Attorney, Agent, or Firm* — Edell, Shapiro & Finnan, LLC

(57) ABSTRACT

A device including an imaging optical unit (9) imaging an object field (5) in an image field (10), a structured mask (7), arranged in the region of the object field (5) via reticle holder (8) displaceable in a reticle scanning direction (21), and a sensor apparatus (25), arranged in the region of the image field (10) via a substrate holder (13) displaceable in a substrate scanning direction (22). The mask (7) has at least one measurement structure (27; 33) to be imaged on the sensor apparatus (25), wherein the sensor apparatus (25) includes at least one line sensor (28) with a multiplicity of sensor elements (29), and affords the possibility of testing the imaging optical unit (9) during the displacement of the substrate holder (13) for exposing a substrate (12) arranged on the substrate holder.

13 Claims, 10 Drawing Sheets

Related U.S. Application Data

(60) Provisional application No. 61/454,683, filed on Mar. 21, 2011.

(51) Int. Cl.
 *G01M 11/02* (2006.01)
 *G03F 7/20* (2006.01)

(58) Field of Classification Search
 USPC .......................................................... 355/67
 See application file for complete search history.

(56) References Cited

U.S. PATENT DOCUMENTS

| | | |
|---|---|---|
| 6,859,515 B2 | 2/2005 | Schultz et al. |
| 7,298,498 B2 | 11/2007 | Takahashi |
| 7,619,748 B2 | 11/2009 | Nakauchi |
| 2003/0137654 A1 | 7/2003 | Mizuno |
| 2004/0179176 A1 | 9/2004 | Ohsaki |
| 2005/0190378 A1 | 9/2005 | Nakauchi |
| 2006/0132775 A1 | 6/2006 | Sengers et al. |
| 2007/0127007 A1* | 6/2007 | Cormont et al. .............. 355/403 |
| 2008/0130012 A1 | 6/2008 | Wegmann et al. |
| 2009/0296058 A1* | 12/2009 | Slotboom et al. .............. 355/53 |

FOREIGN PATENT DOCUMENTS

| | | |
|---|---|---|
| DE | 10 2010 062 763 A1 | 6/2012 |
| EP | 1 568 976 A1 | 8/2005 |
| JP | 2005244126 A | 9/2005 |
| WO | 2005/119368 A2 | 12/2005 |
| WO | 2012/076335 A1 | 6/2012 |

OTHER PUBLICATIONS

German Office Action for 10 2011 005 826.5 dated Nov. 14, 2011.
Office Action in corresponding Japanese Application No. 2014-500349, dated Nov. 27, 2015, along with an English language translation.

\* cited by examiner

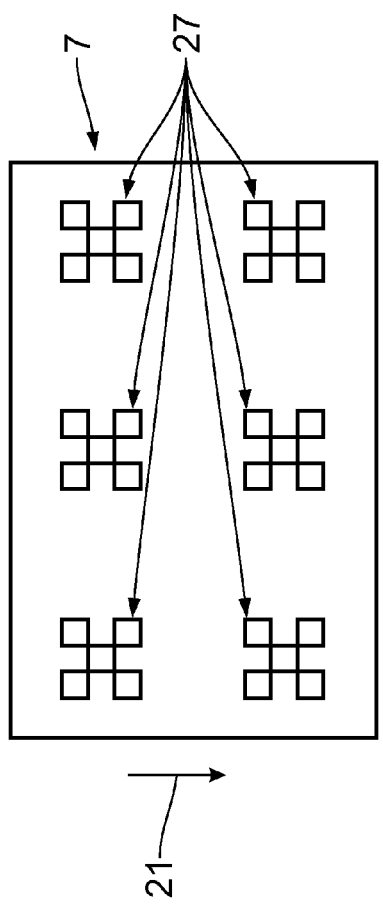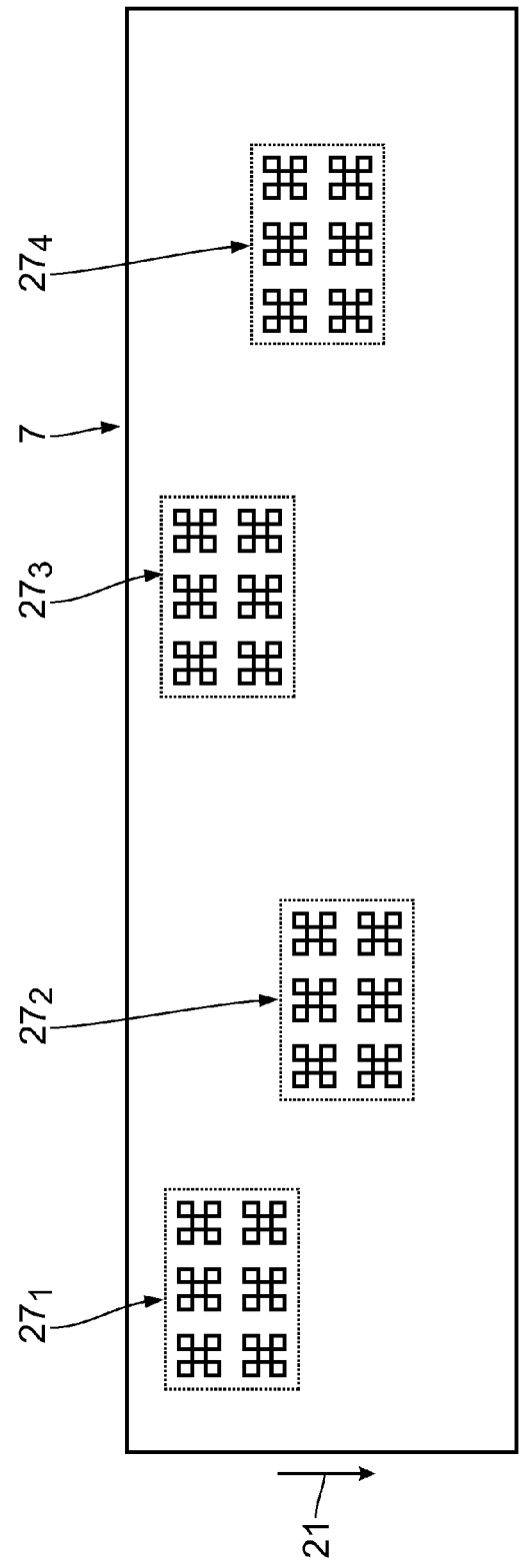

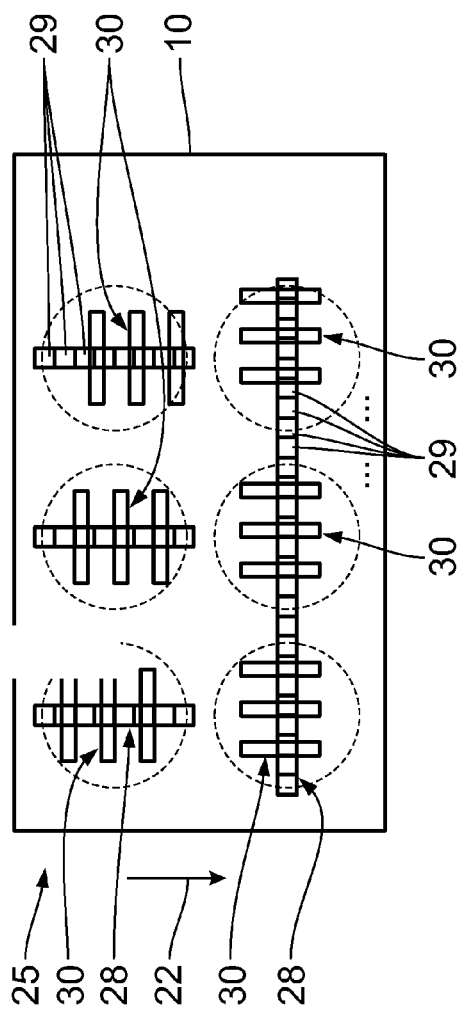
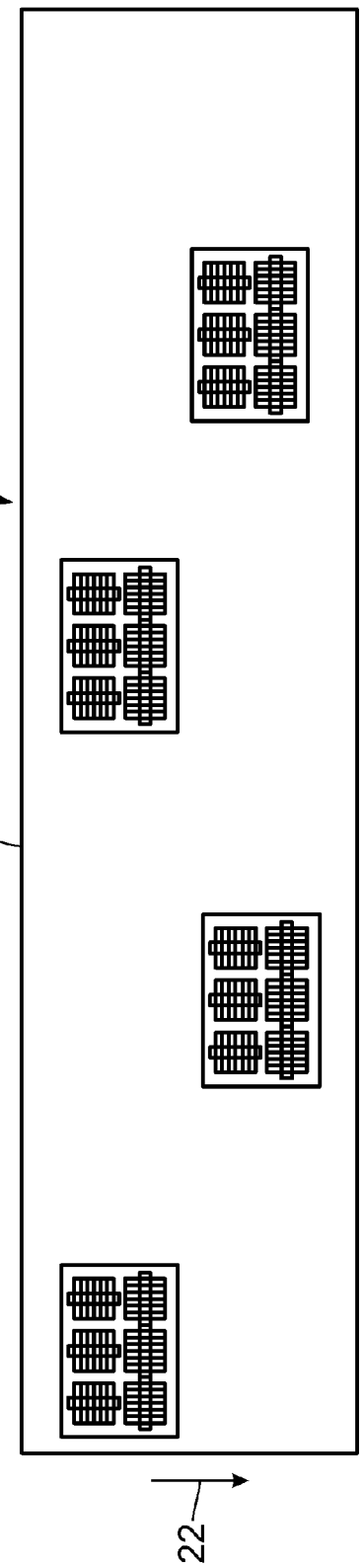
Fig. 5a
Fig. 5b

OPTICAL DEVICE

The present application is a Continuation of International Application No. PCT/EP2012/054813, filed on Mar. 19, 2012, which claims priority of German Patent Application No. 10 2011 005 826.5, filed on May 21, 2011, and U.S. Provisional Application No. 61/454,683, filed on Mar. 21, 2011. The disclosures of these three applications are hereby incorporated herein by reference in their respective entireties.

FIELD OF AND BACKGROUND OF THE INVENTION

The invention relates to an optical device and a method for testing an imaging optical unit. The invention furthermore relates to a projection exposure apparatus, a method for producing a microstructured or nanostructured component and a component produced according to this method.

Generic modules and/or methods have been disclosed in the prior art, for example in U.S. Pat. No. 7,298,498 B2, DE 101 09 929 A1 and US 2008/0130012 A1.

OBJECTS AND SUMMARY OF THE INVENTION

One object of the invention is to optimize an optical device with an imaging optical unit in respect of testing the imaging optical unit.

According to a primary aspect of the invention, a sensor apparatus is arranged with at least one line sensor on a substrate holder in the region of the image field. Hence, this is a scanner-integrated measurement arrangement. In the process, the sensor apparatus is embodied such that it affords the possibility of testing the imaging optical unit during a scanning movement, more particularly during a uniform scanning movement, of the substrate holder. The imaging optical unit can more particularly be tested during an overscan method, during which the substrate holder is moved on, more particularly uniformly moved on, after the actual exposure of a substrate arranged on the former. Accordingly, the imaging optical unit can also be tested before the actual exposure of the substrate.

As a result of using a line sensor and the arrangement according to the invention of same, a test of the imaging optical unit is made possible, even at high scanning speeds. Hence the device according to the invention enables a test of the imaging optical unit with minimal expenditure of time. Moreover, tremors and vibrations are avoided as a result of the possibility of a uniformly continued scanning movement.

The line sensor can more particularly have a substantially one-dimensional embodiment, i.e. the sensor elements thereof can be uniquely characterized by their position in the direction of the orientation of the line sensor. Such line sensors can have image-recording frequencies in the kilohertz range and thus enable a test of the imaging optical unit with the aforementioned advantages.

The sensor apparatus can be designed such that all sensor elements of the sensor apparatus are used for the measurement. This ensures a high read-out frequency since there is no need to distinguish between used and unused sensor elements during the read out.

According to a preferred embodiment, the device comprises at least two line sensors. In particular, these can be arranged parallel or perpendicular to one another. In particular, the line sensors are embodied as separate, spatially separated components. This enables separate, parallel evaluation of the signals from the individual line sensors. This further reduces the expenditure of time required for testing the imaging optical unit. A greater number of line sensors are also possible. In particular, provision can be made for the device to comprise at least three, more particularly at least four, more particularly at least six line sensors. In particular, it can respectively have at least two, more particularly at least three, more particularly at least four, more particularly at least six line sensors per light channel. This further improves the test of the imaging optical unit. A spatially-resolved or field-resolved test of the imaging optical unit is improved by a multiplicity of line sensors. Moreover, this improves a component-resolved test of the imaging optical unit.

The sensor apparatus preferably comprises at least one interferometer. This is preferably a shearing interferometer, more particularly a lateral-shearing interferometer (LSI), a point-diffraction interferometer (PDI) or a line-diffraction interferometer (LDI). Such an embodiment of the sensor apparatus affords the possibility of measuring phase and amplitude of incident waves. In the case of a shearing interferometer, the latter is preferably arranged such that the shearing direction is respectively parallel to the row direction of the associated line sensor. The sensor apparatus preferably comprises a plurality of sets with respectively at least one, more particularly at least two, more particularly at least three shearing gratings, the shearing gratings from different sets having different orientations, more particularly being arranged perpendicular to one another. Within one set, the shearing gratings are preferably arranged respectively displaced with respect to one another in the shearing direction. A lateral phase offset arises as a result of the displacement, and so measurements at different phases are possible parallel in time. Arranging shearing gratings with different orientations makes it also possible, within a single measuring process, to determine e.g. astigmatism in addition to carrying out defocus determination.

The sensors for reading out the sensor signals preferably have a clock frequency of at least 1 kHz. More particularly, the clock frequency is at least 2 kHz, more particularly at least 3 kHz, more particularly at least 5 kHz, more particularly at least 10 kHz, more particularly at least 25 kHz. The time required for a measurement is reduced as a result of such a high clock frequency. This affords the possibility of recording the shearograms during a scanning movement with a uniformly continued scanning speed.

The measurement structure of the mask preferably has a diffraction structure with at least two diffraction directions. In particular, it can have a cross, chequerboard or triangular structure. The measurement mask is more particularly embodied as a coherence-forming mask. The structure of the measurement mask and the embodiment and orientation of the shearing gratings are preferably matched to one another. By using a measurement mask embodied thus, it is possible, in a targeted fashion, to produce test beams for testing the imaging optical unit.

The reticle holder and the substrate holder can preferably be displaced in a synchronized fashion. In particular, they can be displaced in such a synchronized fashion that the association between a point on the measurement mask and the point on the sensor apparatus in the image plane is maintained during the scan. In other words, the image of the measurement mask remains stationary on the respectively associated sensor element or the associated sensor elements. In particular, the scanning speeds of the reticle holder and the substrate holder have the same ratio as the imaging scale of the imaging optical unit. However, in principle it is also possible to displace the substrate holder with a scanning speed that deviates therefrom. More particularly, provision can be made for the reticle holder to be arranged in a stationary fashion and for only the substrate holder with the sensor apparatus to be displaced. This is more particularly provided for scanning a so-called aerial image. In the process, the sensor apparatus scans an image being created in the image plane in a stationary fashion.

The measurement structure is preferably embodied such that a plurality of channels are formed for the channel-resolved test of the imaging optical unit. These channels are also referred to as measurement channels. They are arranged distributed over the image field. More particularly, at least 2, more particularly at least 3, more particularly at least 6, more particularly at least 12, more particularly at least 20, more particularly at least 30 channels are arranged in the image field. This is particularly advantageous for a field- and/or component-resolved test of the imaging optical unit. The spatial association of the individual measurement channels with respect to one another is preferably fixed. This enables a tomographic evaluation of the measurement results, more particularly a component-resolved deduction of so-called lens-heating effects.

A specific region of the sensor apparatus with a multiplicity of sensor elements is preferably associated with each of the channels. At least two line sensors are preferably associated with each channel. In this case, each line sensor advantageously has at least three sensor elements. Hence at least six sensor elements are associated with each channel.

Moreover, the invention is based on a further object of improving a method for testing an imaging optical unit. Advantages associated with this method substantially correspond to those described above.

In particular, provision can be made that the mask to be arranged in the object plane first has structures for producing a microstructured or nanostructured component and secondly has measurement structures for testing the imaging optical unit.

Provision is made for the substrate holder, more particularly the sensor apparatus, to be displaced with a constant speed, more particularly uniformly, in the substrate scanning direction for imaging the imaging structures and the measurement structures. The substrate holder is advantageously displaced uniformly, i.e. with constant scanning speed, while the whole mask is imaged first on the substrate and secondly on the sensor apparatus. This first affords a particularly efficient method for testing the imaging optical unit, and secondly tremors are avoided as a result of the uniform displacement.

The scanning speed is preferably set to at least 100 mm/s. More particularly, it is at least 200 mm/s, more particularly at least 350 mm/s, more particularly at least 500 mm/s.

The substrate holder is preferably displaced synchronized with the reticle holder. In this case, the ratio of the scanning speeds of the reticle holder and the substrate holder preferably corresponds precisely to the imaging ratio of the imaging optical unit. This enables a fixed association between the points on the mask and the points on the wafer or the sensor apparatus.

T radiation used to image the object field in the image field is split into beams. To this end, provision is made, in particular, for an illumination optical unit with a field and pupil facet mirror. The individual rays of a test beam are spaced apart in angular space. This affords the possibility of uniquely associating a test beam with each ray registered by the sensor apparatus. A suitable evaluation of the sensor data thus enables a component-resolved test of the imaging optical unit.

Moreover, the invention is based on objects of developing a projection exposure apparatus, a method for producing a microstructured or nanostructured component and such a component.

Further features and details of the invention emerge from the description of exemplary embodiments on the basis of the drawings. In detail:

BRIEF DESCRIPTION OF THE DRAWINGS

FIG. 4a shows an illustration of a single-channel measurement mask with six partial masks, FIG. 4b shows an illustration of a multichannel measurement mask, with each channel being embodied in accordance with the measurement mask as per FIG. 4a, FIG. 5a shows an illustration of the arrangement of the shearing gratings of a detection unit, corresponding to the measurement mask as per FIG. 4a, FIG. 5b shows an illustration of the arrangement of the shearing gratings of a detection unit, corresponding to the measurement mask as per FIG. 4b.

DETAILED DESCRIPTION OF EXEMPLARY EMBODIMENTS

Figure 1:
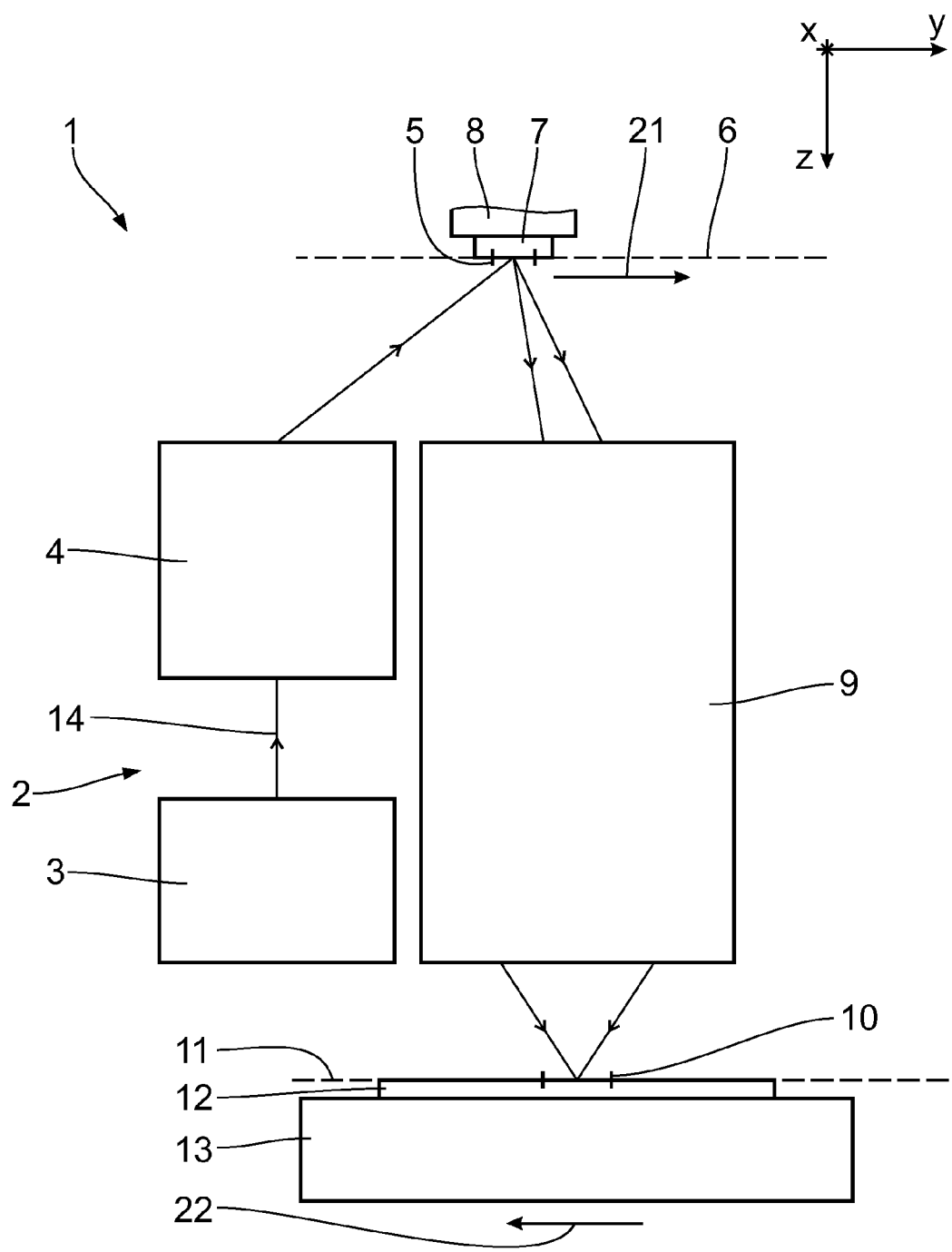
FIG. 1 shows a schematic illustration of a projection exposure apparatus with an illumination system and a projection optical unit.

FIG. 1 schematically shows the components of a projection exposure apparatus 1 for microlithography. In addition to a radiation source 3, an illumination system 2 of the projection exposure apparatus 1 comprises an illumination optical unit 4 for exposing an object field 5 in an object plane 6. A reticle, which is also referred to as mask 7 below, arranged in the object field 5 and held by a reticle holder 8 (merely illustrated in sections), is exposed in this case.

A projection lens 9 serves to image the object field 5 in an image field 10 in an image plane 11. In general, the projection lens 9 is also referred to as imaging optical unit. A structure on the mask 7 is imaged on a light-sensitive layer of a wafer 12, which is held by a wafer holder 13 and arranged in the region of the image field 10 in the image plane 11. In general, the wafer 12 is also referred to as substrate to be exposed and the wafer holder 13 is also referred to as substrate holder. The chemical change of the light-sensitive layer on the wafer 12 during the exposure is also referred to as lithographic step.

The radiation source 3 emits radiation 14 with a wavelength $\lambda<193$ nm. In particular, an argon fluoride (ArF) excimer laser with a wavelength of $\lambda=193$ nm or an $F_2$ laser with a wavelength of $\lambda=157$ nm can be used as radiation source 3. As an alternative to this, the radiation source 3 can be a plasma source, for example a GDPP source or an LPP source. A radiation source based on a synchrotron can also be used as a radiation source 3. The radiation source 3 can, in particular, be an EUV radiation source. The wavelength of such an EUV radiation source 3 is in the range between 5 nm and 30 nm, more particularly in the range between 10 nm and 20 nm, e.g. at 13.5 nm in a vacuum. A person skilled in the art finds information in respect of such a radiation source in e.g. U.S. Pat. No. 6,859,515 B2. The EUV radiation 14 is also referred to as illumination light or imaging light.

A collector 19 is provided for bundling the radiation 14 from the radiation source 3.

The illumination optical unit 4 comprises a multiplicity of optical elements. In this case, these optical elements can be designed to be refractive or reflective. Combinations of refractive and reflective optical elements are also possible. For EUV radiation 14 with a wavelength $\lambda<193$ nm, the illumination optical unit 4 and the projection optical unit 9 more particularly comprise only reflective components. The illumination optical unit 4 comprises a field facet mirror 15 with a multiplicity of field facets 16. The field facet mirror 15 is arranged in a plane of the illumination optical unit 4 that is optically conjugate to the object plane 6. The EUV radiation 14 is reflected to a pupil facet mirror 17 of the illumination optical unit 4 by the field facet mirror 15. The pupil facet mirror 17 has a multiplicity of pupil facets 18. The field facets 16 of the field facet mirror 15 are imaged in the object field 5 with the aid of the pupil facet mirror 17.

There is precisely one pupil facet 18 on the pupil facet mirror 17 associated with each field facet 16 on the field facet mirror 15. A light channel 20 is formed between respectively one field facet 16 and a pupil facet 18. As a result of the facet mirrors 15, 17, the imaging light 14 is split into beams with a predetermined incident angle distribution.

In principle, it is possible to embody the field facet mirror 15 and/or the pupil facet mirror 17 such that the field facets 16 and/or the pupil facets 18 can be pivoted. This affords the possibility of a variable association between the field facets 16 and the pupil facets 18. In particular, this affords the possibility of illumination settings with different illumination angle distributions. This is advantageous, in particular, for testing the projection optical unit 9.

Figure 2:
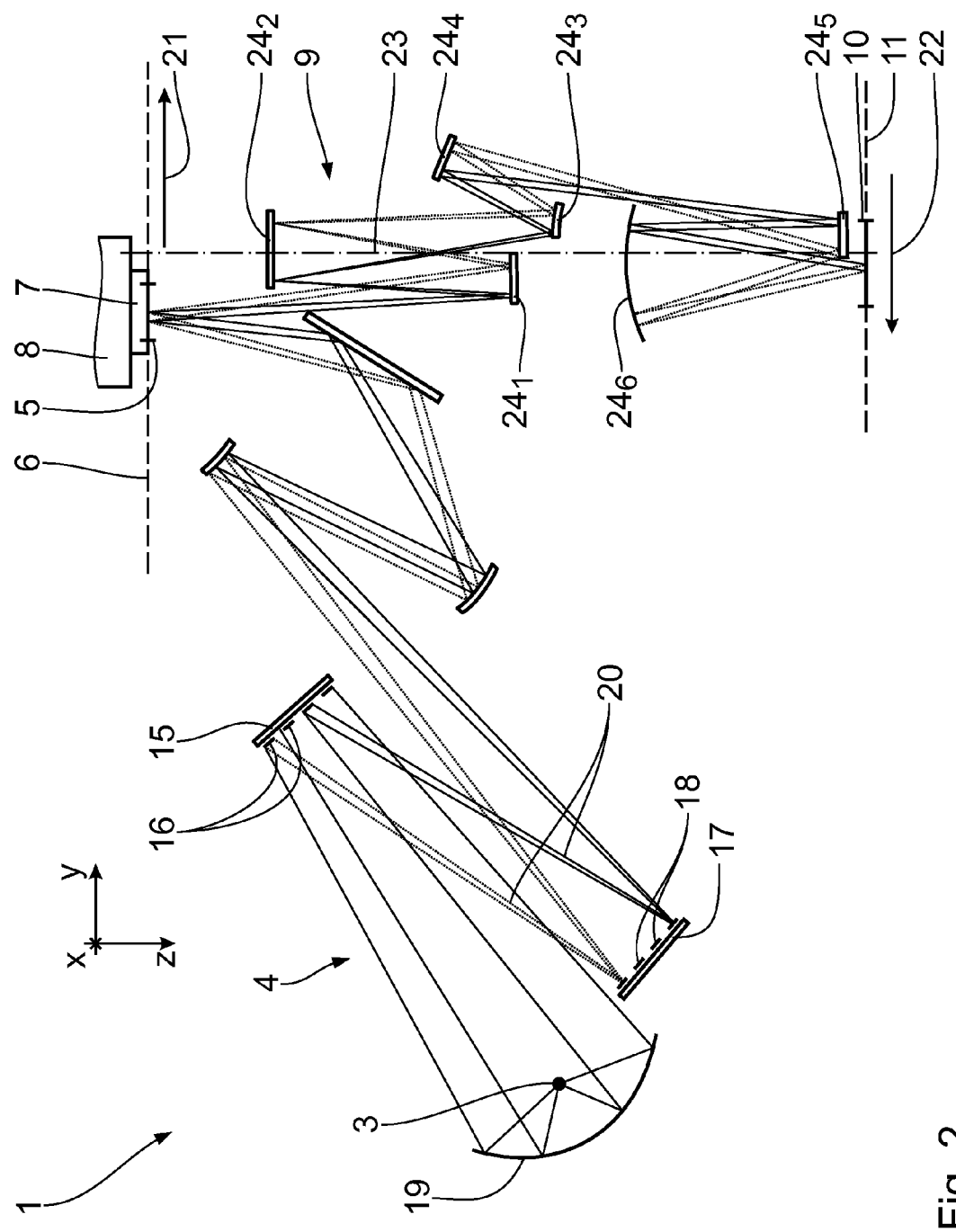
FIG. 2 shows a further schematic view of a projection exposure apparatus, with individual beams being highlighted.

FIG. 2 schematically shows a meridional section of the components of the projection exposure apparatus 1 as per FIG. 1. Here, the ray path of the radiation 14 in the illumination optical unit 4 and the projection optical unit 9 is illustrated schematically.

The reticle holder 8 can be displaced in a controlled fashion such that, during the projection exposure, the structured mask 7 can be displaced in the object plane 6 along a displacement direction. Accordingly, the wafer holder 13 can be displaced in a controlled fashion such that the wafer 12 can be displaced in the image plane 11 along a displacement direction. As a result, the mask 7 and the wafer 12 can be scanned through the object field 5 and through the image field 10, respectively. The displacement direction of the mask 7 is also referred to as the reticle scanning direction 21 below. The displacement direction of the wafer 12 is also referred to as the substrate scanning direction 22 below. The mask 7 and the wafer 12 can preferably be displaced synchronously along the scanning directions 21, 22. Here, the ratio of the scanning speeds preferably precisely corresponds to the imaging ratio of the projection optical unit 9.

To simplify the illustration, a Cartesian xyz-coordinate system has been drawn in the figures. In FIGS. 1 and 2, the x-direction runs perpendicular to the plane of the drawing and into the latter. The y-direction precisely corresponds to the scanning directions 21, 22. The z-direction is parallel to the profile of an optical axis 23 of the projection optical unit 9.

The projection optical unit 9 comprises a multiplicity of projection mirrors $24_i$. In FIG. 2, the projection optical unit 9 has been illustrated with six projection mirrors $24_1$, $24_2$, $24_3$, $24_4$, $24_5$ and $24_6$. In general, the projection optical unit 9 in particular comprises at least three, more particularly at least five, projection mirrors $24_i$. In particular, it can also have at least six, seven or eight projection mirrors $24_i$.

Figure 3:
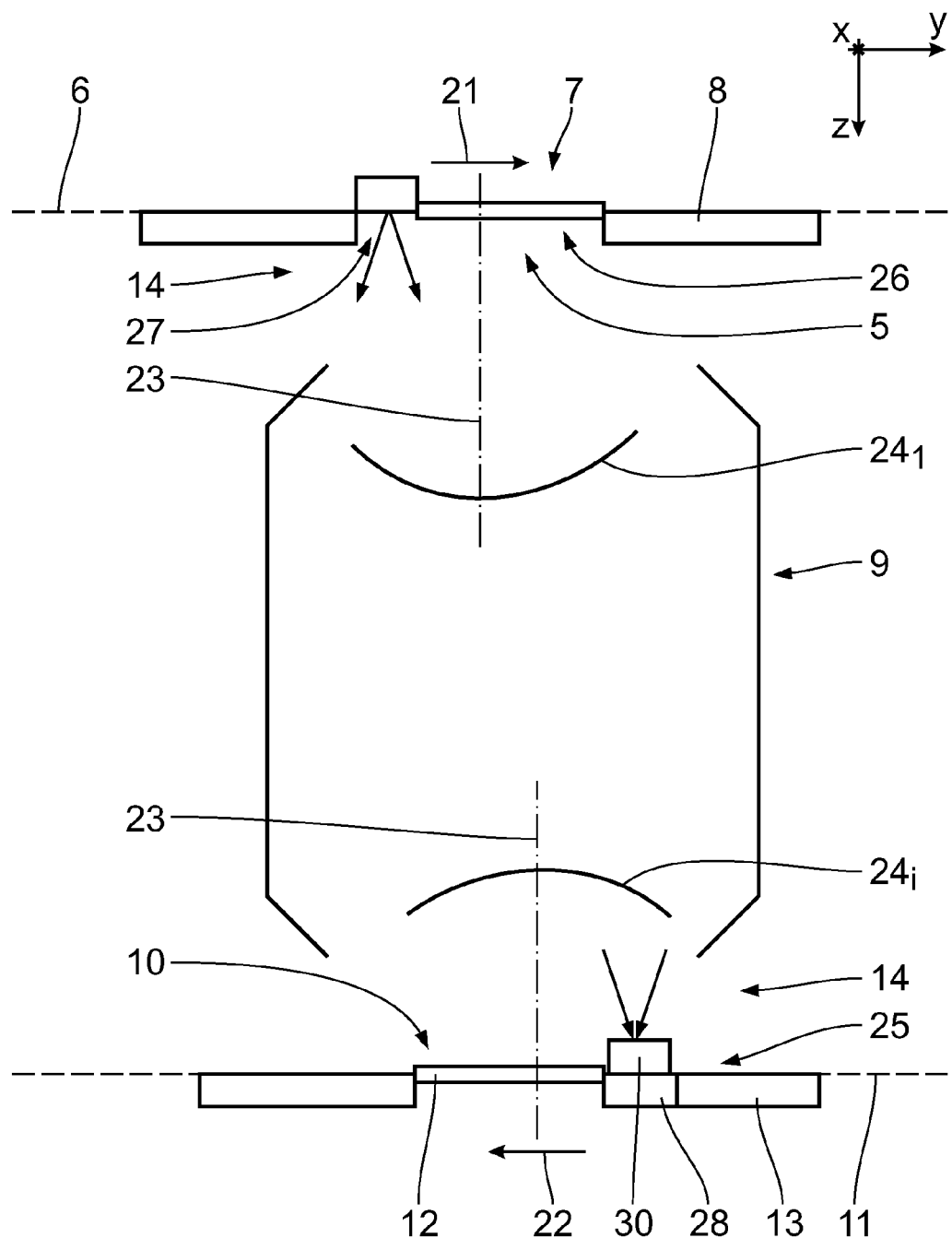
FIG. 3 shows a schematic illustration of the projection optical unit of the projection exposure apparatus as per FIG. 1, together with the reticle holder with the mask and the substrate holder with the sensor apparatus.

FIG. 3 once again schematically illustrates the projection optical unit 9 and, more particularly, the details of the arrangement of the mask 7 on the reticle holder 8 and the details of the arrangement of the wafer 12 and also a sensor apparatus 25, also referred to as detection unit or detector apparatus. The mask 7 is arranged in the region of the object plane 6, more particularly in the region of the object field 5, by means of the reticle holder 8 such that it can be displaced in the reticle scanning direction 21. It can be embodied as transmissive mask or as reflective mask. Accordingly, the substrate 12 and, more particularly, the sensor apparatus 25 are arranged in the region of the image plane 11, more particularly in the region of the image field 10, by means of the substrate holder 13 such that they can be displaced in the substrate scanning direction 22.

The substrate holder 13 and the reticle holder 8 can in particular be displaced with respect to one another in a synchronized fashion. More particularly, they can be displaced synchronized with respect to one another such that the association between a point on the mask 7 and a point on the substrate 12 or the sensor apparatus 25 is maintained during a scan, i.e. during the displacement. This is achieved by virtue of the fact that the ratio of the scanning speeds precisely corresponds to the imaging ratio of the projection optical unit 9. Here, this mode of operation is referred to as a field point scan. In principle, it is also possible for the reticle holder 8 or, more particularly, the substrate holder 13 to be displaced with a scanning speed that deviates therefrom. Provision can be made, in particular, for a so-called aerial image scan, for the reticle holder 8 to be stopped at least from time to time, i.e. for the latter to be arranged in a stationary fashion. During this method of operation, the mask 7 can fixedly select specific field points at which, in a respectively stationary fashion, an image is created in the image plane 11. This image can be scanned by means of the sensor apparatus 25 by displacing the substrate holder 13 in the substrate scanning direction 22. Moreover, in principle, a mode of operation is feasible which is situated between the two described above, i.e. between the unchanging assignment of points on the mask 7 to points on the substrate 12 during the field point scan on the one hand and the stationary arrangement of the mask 7 during the aerial image scan on the other hand.

In the following text, a first embodiment of the mask 7 is described in more detail with reference to FIG. 4a. The mask 7 has structures to be imaged on the substrate 12. These structures comprise the actual imaging structure 26 for exposing the wafer 12, more particularly the light-sensitive coating of the wafer 12, and at least one measurement structure 27 to be imaged on the sensor apparatus 25. In general, both the actual imaging structure 26 and the measurement structure 27 form structures to be imaged.

The measurement structure 27 is advantageously arranged adjacent to the imaging structure 26. In particular, it is arranged adjacent to the imaging structure 26 in the reticle scanning direction 21. However, in principle, it is also feasible to arrange the measurement structure 27 adjacent to the imaging structure 26 in a direction perpendicular to the reticle scanning direction 21.

According to the invention, provision is made to arrange both the imaging structure 26 and the measurement structure 27 on the mask 7. However, in principle, it would also be feasible to embody the measurement structure 27 and the imaging structure 26 as separate masks 7. In this case, the masks 7 are arranged adjacent to one another, more particularly adjacent to one another in the reticle scanning direction 21, on the reticle holder 8. The mask 7 with the measurement structure 27 is more particularly fixedly arranged on the reticle holder 8. It is securely connected to the reticle holder 8. The mask 7 with the measurement structure 27 and/or the mask 7 with the imaging structure 26 are advantageously interchangeable in this case. In particular, they can be interchanged independently of one another.

In the following text, the region of the mask 7 with the measurement structure 27, i.e. the measurement structure 27, is described in more detail. The measurement structure 27 is designed as diffraction structure. In particular, it is embodied as diffraction structure with at least two diffraction directions. By way of example, as illustrated in FIG. 4a, it can be embodied as chequerboard structure. It can also be embodied as a cross structure or triangle structure. In particular, the measurement structure 27 is designed as coherence-forming mask. It can be embodied as a perforated mask or as a reflective mask. It preferably forms origins of coherent waves of the imaging radiation 14.

The measurement structure 27 comprises a plurality of partial structures for each measurement channel. In particular, the partial structures have an identical design. The arrangement of the partial structures of the mask 7 is matched to the embodiment of the sensor apparatus 25, which will still be described in more detail below. In particular, the measurement structure 27 comprises at least two, more particularly at least three, more particularly at least four, more particularly at least five, preferably at least six partial structures. Here, the partial structures are preferably, at least in part, arranged in one or more rows.

While FIG. 4a shows the design of the mask 7, more particularly of the measurement structure 27, for a single-channel embodiment, FIG. 4b illustrates, in an exemplary fashion, a multi-channel embodiment of the measurement structures 27 of the mask 7. According to the exemplary embodiment illustrated in FIG. 4b, the mask 7 comprises four measurement structures $27_1$, $27_2$, $27_3$ and $27_4$, which respectively comprise six partial structures in accordance with the embodiment illustrated in FIG. 4a. The four measurement structures $27_{1...4}$ are arranged distributed over the object field 5 perpendicular to the reticle scanning direction 21. Here, each measurement structure $27_{1...4}$ forms one measurement channel. Hence the measurement structures $27_{1...4}$ enable a channel-resolved test of the projection optical unit 9. It is self-evident that the mask 7 may also comprise a different number of measurement structures $27_i$.

In particular, the mask 7 can comprise at least two, more particularly at least three, more particularly at least four, more particularly at least six, more particularly at least eight, twelve, twenty, thirty or more measurement structures 27.

In respect of further details of the measurement structures 27, reference is made to DE 101 09 929 A1.

In the following text, a first exemplary embodiment of the sensor apparatus 25 is described with reference to FIG. 5a. The sensor apparatus 25 as per FIG. 5a corresponds to the single-channel mask 7 with the measurement structure 27 as per FIG. 4a. Accordingly, the sensor apparatus 25 as per FIG. 5b corresponds to the multi-channel embodiment of the mask 7 as per FIG. 4b. The measurement structure 27 of the mask 7 is imaged in the image field 10 by means of the projection optical unit 9. Here, in FIG. 5a, the point of the image of the individual partial structures is respectively denoted in an exemplary fashion by a dashed line.

The sensor apparatus 25 respectively comprises a plurality of line sensors 28 for each measurement channel. In general, it comprises at least one line sensor 28, more particularly at least two, more particularly at least three, more particularly at least four, more particularly at least six line sensors 28. The line sensors 28 respectively comprise a multiplicity of sensor elements 29. The line sensors 28 are respectively, in a pair-wise fashion, arranged parallel or perpendicular to one another. Each of the partial structures of a measurement structure 27 respectively is associated with at least one part, more particularly a separate part, of a line sensor 28. This means that the line sensors 28 are designed and arranged such that a uniquely determined, separate part of a line sensor 28, on which the image of the respective partial structure is imaged during the test of the projection optical unit 9, is provided for each of the partial structures of a measurement structure 27.

The line sensors 28 more particularly are fast line sensors. They have a clock frequency of at least 1 kHz. The clock frequency of the line sensors 28, more particularly of the sensor elements 29, is preferably at least 2 kHz, more particularly at least 3 kHz, more particularly at least 5 kHz, more particularly at least 10 kHz, more particularly at least 25 kHz. By way of example, the line sensors 28 are embodied as diode rows. They afford the possibility of measuring a field point, and hence of testing the projection optical unit 9, in a very short time, more particularly in less than 1 ms, more particularly in less than 0.5 ms, more particularly in less than 0.33 ms, more particularly in less than 0.2 ms, more particularly in less than 0.1 ms.

Here, the time available for obtaining a measurement value emerges from the diameter of the isoplanatic patch, i.e. the field region in the image field 10 within which the aberrations are considered unchanged, the maximum aberrations, the required measurement accuracy and the scanning speed of the substrate holder 13. In the present case, it is of the order of at most one millisecond.

Hence, the sensor apparatus 25 is embodied in particular such that it enables a test of the projection optical unit 9 during the displacement of the substrate holder 13 for exposing the substrate 12 arranged on the latter. In particular, this is also understood to mean that the projection optical unit 9 is tested before and/or subsequent to the actual exposure of the light-sensitive layer on the substrate 12, with the substrate holder 13 being displaced with a uniformly continued scanning speed in the substrate scanning direction 22.

The sensor apparatus 25 moreover comprises at least one interferometric apparatus. According to the exemplary embodiment illustrated in FIG. 5a, the interferometric apparatus comprises a multiplicity of shearing gratings 30. In the embodiment embodied in FIG. 5a, provision is made for two sets of respectively three shearing gratings 30, with the shearing gratings 30 of one set respectively having the same orientation. The shearing gratings 30 of different sets have different orientations. They are, in particular, arranged rotated by 90° with respect to one another. The orientations of the shearing gratings preferably precisely correspond to the substrate scanning direction 22 and the direction perpendicular thereto. This affords the possibility of obtaining deflections of the wave front in two directions. The shearing gratings 30 of one set are respectively arranged displaced relative to one another in the shearing direction. This generates a phase shift required for evaluating the shearogram phase step. This avoids a shift of the shearing gratings for evaluating the phase step.

The shearing gratings 30 are in each case arranged at a distance from one another. Here, respectively two adjacent shearing gratings 30 are arranged at a distance from one another which is at least so large that the shearograms respectively generated by the shearing gratings 30 are without overlap in the evaluation region. The shearograms generated by the individual shearing gratings 30 of a test channel are more particularly incident on pair-wise different regions of the line sensors 28.

To the extent that provision is made for a use of the sensor apparatus 25 in the case of an immersion scanner, the shearing gratings 30 are provided with an image grating protective layer in order to increase the duration of their service life. In respect of details, reference is made to WO 2005/119368 A2.

In the case of applications of the sensor apparatus 25 in EUV projection exposure apparatuses, the line sensor 28 more particularly comprises sensor elements 29 that are sensitive in the EUV spectral range. Alternatively, or in addition thereto, the sensor row 28 can be provided with a quantum conversion layer. In respect of details of the quantum conversion layer, reference is made to DE 102 53 874 A1.

The device according to the invention for testing the projection optical unit 9, comprising the mask 7 with the measurement structures 27 and the sensor apparatus 25, thus, in principle, is suitable for both projection exposure apparatuses in the form of an immersion scanner and for EUV projection exposure apparatuses.

The shearing gratings 30 are arranged in the region of the image plane 11. In particular, they are arranged so close to the image plane 11 that the image of each of the partial structures of the measurement structure 27 of each of the measurement channels is respectively incident on precisely one specific shearing grating 30. The mask 7, more particularly the measurement structures 27, and the sensor apparatus 25, more particularly the interferometric apparatus thereof, are therefore matched to one another such that a plurality of measurement channels are formed for the channel-resolved test of the projection optical unit 9. A specific region of the sensor apparatus 25 with at least one line sensor 28, more particularly at least two line sensors 28, is associated with each channel.

Each of the channels of the sensor apparatus 25 preferably comprises at least three shearing gratings, displaced relative to one another in the shearing direction. Each of the channels preferably respectively comprises at least two sets with respectively at least three shearing gratings 30, displaced relative to one another in the shearing direction, with the shearing gratings 30 of different sets having different orientations. The shearing gratings 30 of one set respectively have the same orientation. They are arranged respectively displaced relative to one another in the shearing direction.

According to the embodiment illustrated in FIG. 5b, the sensor apparatus 25 has a multi-channel, more particularly four-channel, design. Here, the design of each channel corresponds to those described above with reference to FIG. 5a. The channels are arranged distributed over the image field 10, i.e. over the scanner slit. In particular, provision is made for arranging at least three separate channels in the image field 10. A multiplicity of channels is preferably arranged distributed over the image field 10, more particularly in a uniform fashion. In particular, the number of channels is at least three, more particularly at least four, more particularly at least six, more particularly at least twelve, more particularly at least twenty, more particularly at least thirty.

A multi-channel embodiment affords the possibility of establishing a field-dependent tilt of the wave front. It is possible to determine a distortion therefrom. In respect of details for determining a field-dependent tilt of the wave front, reference is made to DE 101 09 929 A1.

Figure 5C:
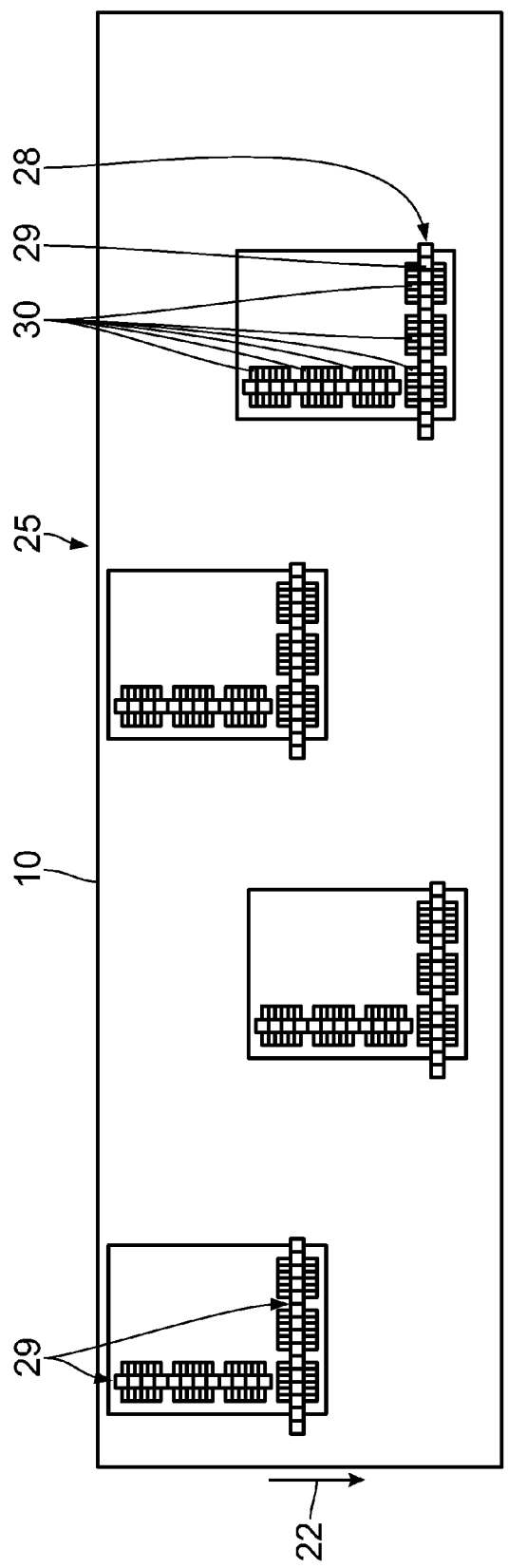
FIG. 5c shows an alternative embodiment of the detection unit.

FIG. 5c shows an alternative embodiment, in which the shearing gratings 30 of the sensor apparatus 25 are arranged in an L-shape. This L-shaped arrangement affords the possibility of providing a single line sensor 28 for respectively three shearing gratings 30 of a given orientation. In this embodiment, all shearing gratings 30 with a predetermined orientation are respectively arranged offset with respect to one another in the shearing direction only. Since each shearing grating produces all shearing in a specific spatial direction—the shearing direction—this arrangement affords the possibility of covering and detecting the shearograms of all of these shearing gratings 30 using a single line sensor 28, which in each case is arranged precisely in this shearing direction.

The embodiment according to the invention affords the possibility of a field-resolved measurement of wave-front aberrations in the pupil. Moreover, it is possible to determine the irradiation strength distribution in the pupil. In particular, the device according to the invention affords the possibility of a component-resolved test of the projection optical unit 9. It is possible to measure component-resolved faults, more particularly so-called lens-heating effects. Here, the fact that is exploited, in particular, is that a predetermined illumination setting with a predetermined angular distribution of the imaging radiation 14 is used to illuminate the mask 7, more particularly the measurement structures 27. More particularly, the fact is exploited that the imaging radiation 14 used to image the mask 7 on the sensor apparatus 25 is split into beams by the facet mirrors 15, 17.

Figure 6:
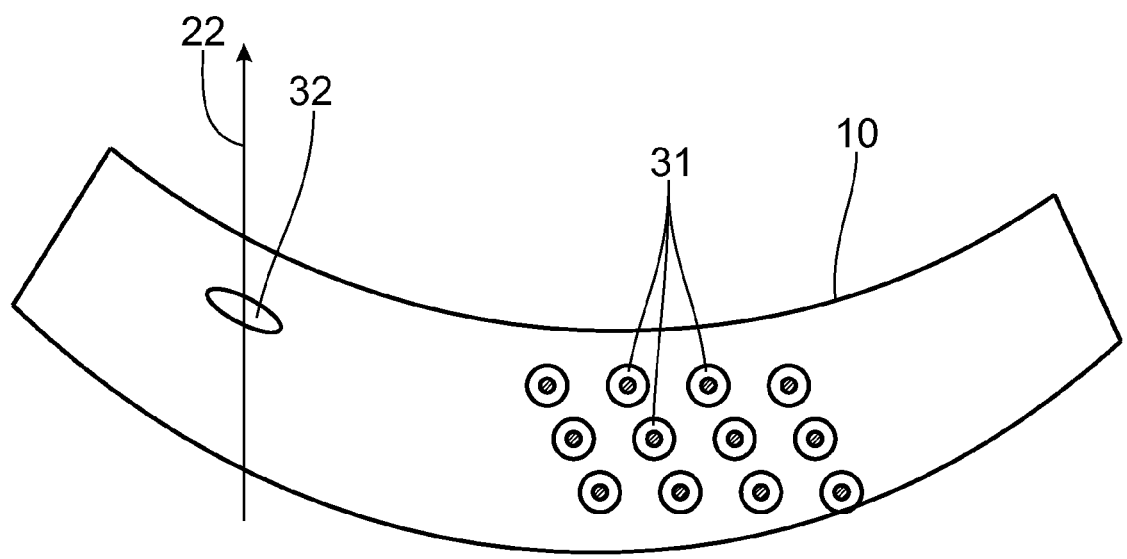
FIG. 6 shows a schematic illustration of the image field with an exemplary arrangement of measurement channels.

FIG. 6 once again illustrates the geometry of the image field 10 in an exemplary fashion. The image field 10 can have a curved design, more particularly the shape of an annular section. In particular, the dimension of the short side thereof is approximately 2 mm. In particular, the dimension of the longer side is approximately 26 mm. It is self-evident that other dimensions are likewise possible. In FIG. 6, an arrangement of twelve measurement channels is illustrated in an exemplary fashion. Here, each of the measurement channels comprises an arrangement of shearing gratings 30 and line sensors 28 as per FIGS. 5a and 5c, which are not illustrated in FIG. 6. Moreover, an aperture 31 for each measurement channel is respectively illustrated schematically in FIG. 6.

Moreover, a dimension of the isoplanatic patch 32, i.e. the region of the image field 10 within which the aberrations are considered unchanged, is illustrated schematically in FIG. 6.

Figure 7A:
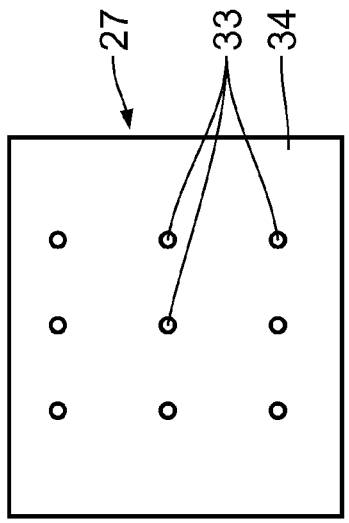
FIG. 7a shows an illustration of the measurement mask as per FIG. 7.
Figure 7B:
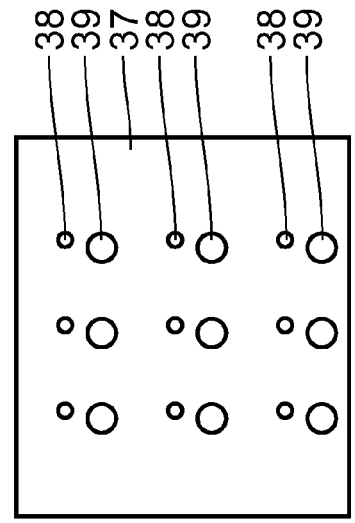
FIG. 7b shows an illustration of the mask of the detection unit as per FIG. 7.
Figure 7:
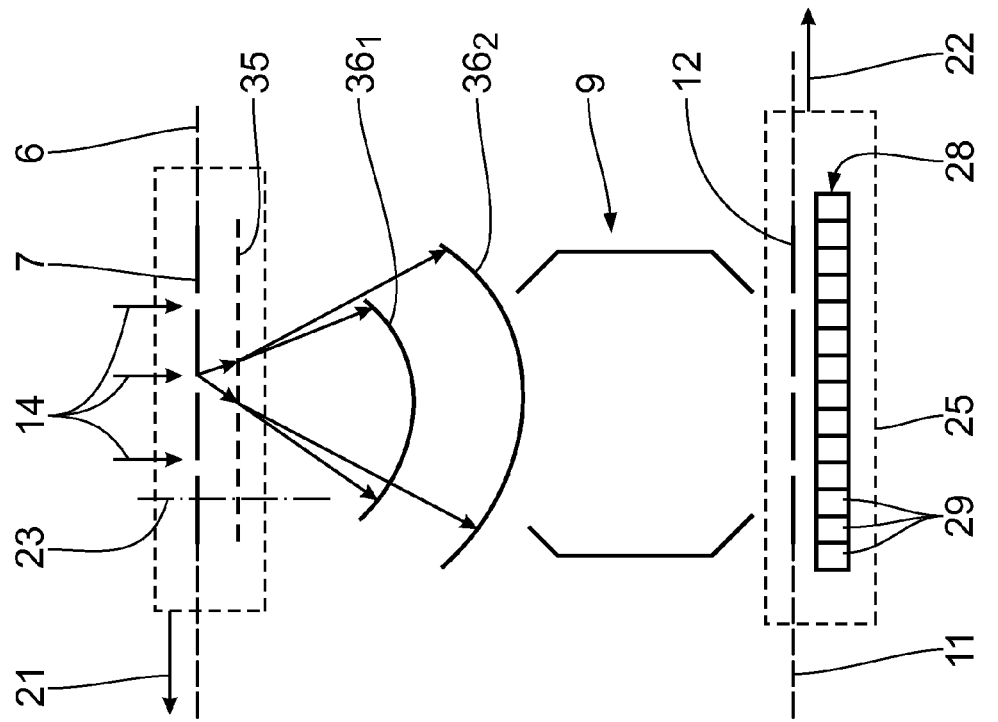
FIG. 7 shows an illustration according to FIG. 3 with an alternative measurement mask and corresponding mask of the detection unit.

In the following text, a further exemplary embodiment of the invention will be described with reference to FIGS. 7 to 7c. The exemplary embodiment substantially corresponds to the embodiments described above, and so reference is hereby made to the description thereof. As an alternative to the above-described shearing interferometer, provision is made for a so-called point diffraction interferometer (PDI) in this embodiment. As an alternative to this, a line diffraction interferometer (LDI) is also possible. These interferometers also afford the possibility of testing the projection optical unit 9 in a single pass-through. In this embodiment, the mask 7 comprises measurement structures 27 which are embodied in a perforated mask 34 in the form of so-called pinholes 33. The perforated mask 34 is followed by a shearing grating 35 in the direction of the optical axis 23. The combination of perforated mask 34 and shearing grating 35 serves to generate spherical waves $36_1$, $36_2$, which run at a slight tilt to one another and are illustrated in FIG. 7 in an exemplary fashion.

In this embodiment, the sensor apparatus 25 comprises a pinhole/pinhole-diaphragm mask 37 arranged in the region of the image plane 11. For each pinhole 33 of the perforated mask 34, the pinhole/pinhole-diaphragm mask 37 has an associated pair of a pinhole 38 and a pinhole diaphragm 39. The pinholes 38 and pinhole diaphragms 39 of each pair are respectively arranged at a distance from one another. The distances between associated pinholes 38 and pinhole diaphragms 39 can differ from channel to channel. In order to enable a tomographic evaluation of the measurement results, provision can be made for calibrating the PDI.

The pinholes 38 are arranged such that the pinhole 38 of the pinhole/pinhole-diaphragm mask 37 is arranged precisely at the point of the focus of the image of a pinhole 33 of the perforated mask 34. It is more particularly arranged at the point of the zero-order maximum of the diffraction pattern of a pinhole 33 of the perforated mask 34 generated by the shearing grating 35. Accordingly, the pinhole diaphragm 39 is respectively arranged at the point of a higher-order maximum, more particularly, for example, at the point of the first-order maximum, of the diffraction pattern of a pinhole 33 of the perforated mask 34 generated by the shearing grating 35.

The pinholes 38 of the pinhole/pinhole-diaphragm mask 37 in turn form origins of spherical waves. The pinhole diaphragms 39 have a clear opening that is so large that a higher-order maximum of the diffraction pattern, more particularly the first-order maximum of this diffraction pattern, generated by the shearing grating 35 can pass through said opening, substantially without diffraction effects. Hence, the sensor elements 29 of the line sensors 28 respectively register part of an interference pattern between a spherical wave originating from the pinhole 38 and the wave front passing through the pinhole diaphragm 39. This interference pattern contains information from which it is possible to deduce aberrations in the projection optical unit 9.

Figure 7C:
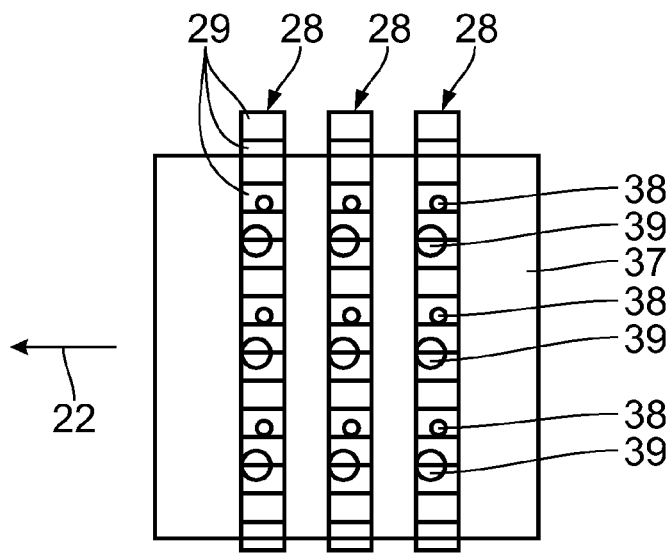
FIG. 7c shows an illustration of the detection unit as per FIG. 7.

FIG. 7c schematically illustrates the arrangement of the line sensors 28 with the sensor elements 29 relative to the pinhole/pinhole-diaphragm mask 37. In particular, the line sensors 28 are respectively arranged across, preferably perpendicular to, the substrate scanning direction 22. Here, in particular, a field-point scan is provided as method of operation. In principle, there may also be an aerial image scan or an operating mode situated between these two.

Figure 8:
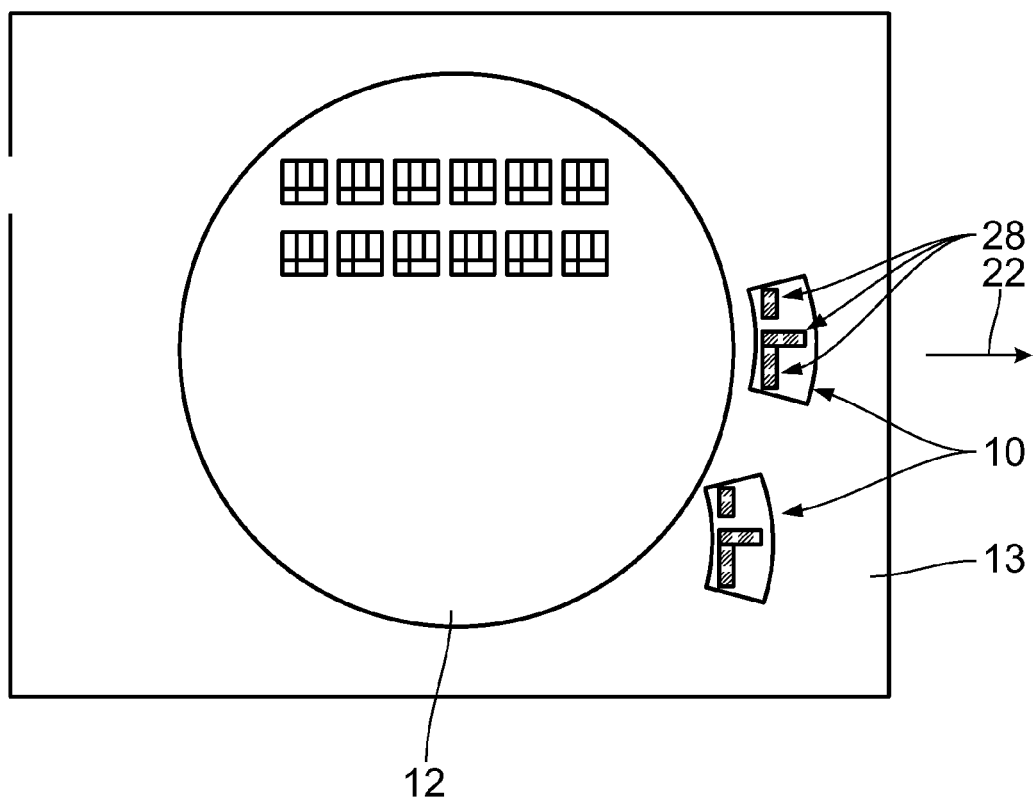
FIG. 8 shows a schematic illustration of the arrangement of the detection unit on the substrate holder and FIG. 9 shows a schematic illustration of a further arrangement of the detection unit on the substrate holder.

FIG. 8 illustrates, in an exemplary fashion, two possible arrangements of the sensor apparatus 25 on the substrate holder 13 relative to the wafer 12. Here, the image field 10 and three line sensors 28, arranged in an exemplary fashion, are respectively illustrated in place of the sensor apparatus 25. In particular, the sensor apparatus 25 is arranged in front of the wafer 12 in the substrate scanning direction 22. What this achieves is that the projection optical unit 9 is tested before the wafer 12 is exposed. The corresponding result can preferably already be taken into account when exposing the wafer 12. As an alternative to this, it is also possible to arrange the sensor apparatus 25 behind the wafer 12 in the substrate scanning direction 22. Moreover, the sensor apparatus 25 can also be arranged offset to the wafer 12 in a direction perpendicular to the substrate scanning direction 22. A so-called overscan is provided for testing the projection optical unit 9. This means that regions arranged adjacent to the wafer 12 are exposed. Here, the wafer holder 13 is preferably displaced with a uniformly continued scanning speed in the substrate scanning direction 22.

Figure 9:
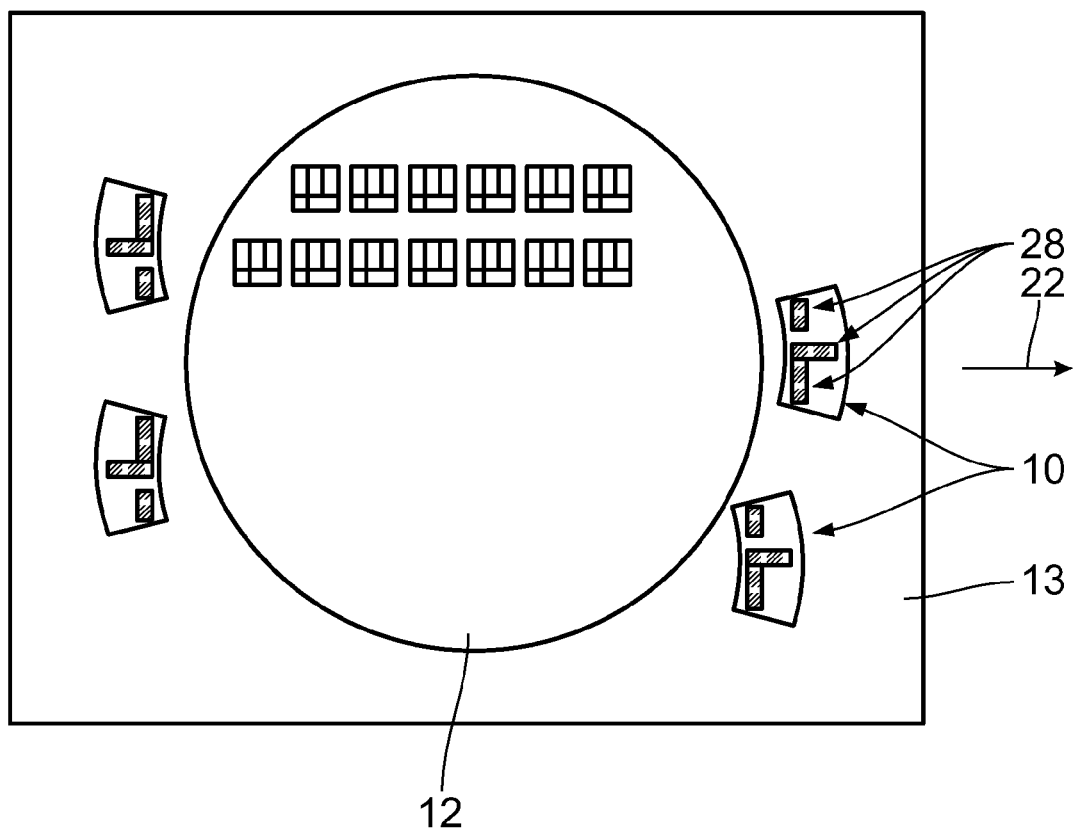

According to the exemplary embodiment illustrated in FIG. 9, the sensor apparatus 25 can also comprise a plurality of line sensors 28, which are arranged on mutually opposite sides of the wafer 12, i.e. in front of and behind the wafer 12, in respect of the substrate scanning direction 22.

In order to test the projection optical unit 9 during the exposure of the light-sensitive coating of a wafer 12, the mask 7 with the structures 26, 27 to be imaged is arranged in the object plane 6 of the projection optical unit 9. The wafer 12 and the sensor apparatus 25 are accordingly arranged in the region of the image plane 11 of the projection optical unit 9 by means of the substrate holder 13. The imaging structures 26 of the mask 7 are imaged on the wafer 12, more particularly on the light-sensitive coating thereof, as a result of suitably displacing the reticle holder 8 and/or the substrate holder 13 and illuminating the mask 7. The measurement structures 27 and 33 of the mask 7 are correspondingly imaged on the sensor apparatus 25. The measurements can more particularly be undertaken in an integrating fashion, i.e. during a displacement of the sensor apparatus 25 in the image field 10. More particularly, provision can be made for in each case establishing one measurement value when scanning the isoplanatic patch. The result is an integrated, more particularly a scanner-slit integrated, and/or field-resolved measurement of the wavefront aberration.

The projection optical unit 9 is more particularly tested during a single pass therethrough.

The intensity and/or phase distribution detected by the sensor apparatus 25 can be subject to further online and/or offline processing. In respect of details of the further processing of the data measured by the sensor apparatus 25, reference is made to DE 10 2010 062 763.1.

According to the invention, provision is made for the mask 7 with the imaging structures 26 and the measurement structures 27 for exposing the wafer 12 to be displaced by means of the reticle holder 8, at least in the reticle scanning direction 21. The substrate holder 13 with the wafer 12 and the sensor apparatus 25 is correspondingly displaced in the substrate scanning direction 22. The reticle holder 8 and the substrate holder 13 can more particularly be displaced with respect to one another in a synchronized fashion. The ratio of the scanning speeds of the reticle holder 8 and the substrate holder 13 precisely corresponds to the imaging ratio of the projection optical unit 9.

In particular, the scanning speed of the substrate holder 13 is at least 100 mm/s, more particularly at least 200 mm/s, more particularly at least 350 mm/s, more particularly at least 500 mm/s.

When imaging the imaging structures 26 and the measurement structures 27 of the mask 7 on the wafer 12 and the sensor apparatus 25, respectively, the substrate holder 13 is displaced with a constant scanning speed $v_{scan}$ in the substrate scanning direction 22. Hence, the method according to the invention enables a field-resolved wave-front measurement technique, more particularly a lens-heating measurement technique, at scanning speed.

For the purpose of a component-resolved test of the projection optical unit 9, it is possible, in particular, to exploit the fact that the radiation 14 used to image the object field 5 in the image field 10 is split into separate radiation channels, more particularly into radiation beams with a specific radiation angular distribution, by means of the two facet mirrors 15, 17.

The method according to the invention affords the possibility of testing the projection optical unit 9 during a continuously continued scan of the substrate holder 13.

When the projection exposure apparatus 1 is used, the mask 7 and the wafer 12, which carries a coating that is light-sensitive to the illumination light 14, are provided. Subsequently, at least one section of the imaging structure 26 of the mask 7 is projected onto the wafer 12 with the aid of the projection exposure apparatus 1. The reticle holder 8 and/or the substrate holder 13 can be displaced in the scanning direction 21, 22 parallel to the object plane 6 and parallel to the image plane 11, respectively, while the imaging structure 26 of the mask 7 is projected onto the wafer 12. The mask 7 and the wafer 12 can preferably be displaced synchronously with respect to one another. The test of the projection optical unit 9 with the aid of imaging the measurement structures 27 on the sensor apparatus 25 as per the above-described method can take place before, while or after the wafer 12 is exposed. Finally, the light-sensitive layer on the wafer 12 that was exposed to the illumination light 14 is developed. This is how a microstructured or nanostructured component, more particularly a semiconductor chip, is produced.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. Optical device comprising:
   a. an imaging optical unit for imaging an object field in an image field,
   b. a structured mask, which is arranged in the region of an object plane of the imaging optical unit via a reticle holder configured to be displaced in a reticle scanning direction, and
   c. a sensor apparatus, which is arranged in the region of an image plane of the imaging optical unit via a substrate holder configured to be displaced in a substrate scanning direction,
   d. wherein the mask has at least one measurement structure to be imaged on the sensor apparatus,
   e. wherein the sensor apparatus comprises at least two line sensors, each with a multiplicity of sensor elements,
   f. wherein the line sensors are embodied as separate, spatially separated components, and
   g. wherein the sensor apparatus is configured for testing the imaging optical unit during a displacement of the substrate holder for exposing a substrate arranged on the substrate holder.

2. Device according to claim 1, wherein the two line sensors are arranged perpendicular to each other.

3. Device according to claim 1, wherein the sensor apparatus comprises at least one interferometric apparatus.

4. Device according to claim 1, wherein the sensor elements have a clock frequency of at least 1 kHz.

5. Device according to claim 1, wherein the measurement structure has a diffraction structure with at least two diffraction directions.

6. Device according to claim 1, wherein the measurement structure is embodied such that a plurality of channels are formed for a channel-resolved test of the imaging optical unit.

7. Device according to claim 6, wherein a specific region of the sensor apparatus with at least one line sensor with a multiplicity of sensor elements is associated with each of the channels.

8. Projection exposure apparatus comprising:
   an illumination system and
   an optical device as claimed in claim 1.

9. Method for producing a microstructured or nanostructured component, comprising:
   providing a mask,
   providing a wafer with a light-sensitive coating,
   providing a sensor apparatus,
   projecting at least one section of the mask onto the wafer with the projection exposure apparatus as claimed in claim 8,
   projecting at least one section of the mask onto the sensor apparatus with the projection exposure apparatus, and
   developing the light-sensitive coating on the wafer.

10. Method for testing an imaging optical unit, comprising:
    providing an imaging optical unit with at least one optical element for imaging an object field in an image field,
    providing a substrate with a light-sensitive coating,
    providing a mask with structures to be imaged,
    providing a sensor apparatus with at least two line sensors, each with a multiplicity of sensor elements,
       wherein the line sensors are embodied as separate, spatially separated components,
    arranging the mask in an object plane of the imaging optical unit with a reticle holder configured to be displaced in a reticle scanning direction,
    arranging the substrate in an image plane of the imaging optical unit with a substrate holder configured to be displaced in a substrate scanning direction,
    arranging the sensor apparatus in the region of the image plane with the substrate holder,
    imaging at least a first part of the structures to be imaged on the substrate with the imaging optical unit,
    imaging a second part of the structures of the mask to be imaged on the sensor apparatus with the imaging optical unit,
    wherein the substrate holder is displaced with constant scanning speed in the substrate scanning direction in order to image the first part and the second part of the structures to be imaged.

11. Method according to claim 10, wherein the scanning speed is at least 100 mm/s.

12. Method according to claim 10, wherein the reticle holder and the substrate holder are displaced synchronously for imaging the structures to be imaged.

13. Method according to claim 10, wherein radiation used to image the object field in the image field is split into beams.

* * * * *